US012586888B2

(12) United States Patent
Belluot et al.

(10) Patent No.: US 12,586,888 B2
(45) Date of Patent: Mar. 24, 2026

(54) SOLID-STATE POWER AMPLIFIER COMPRISED OF A TWO-PART WAVEGUIDE HAVING AN IMPEDANCE RIDGE, WHERE THE TWO PARTS ARE CLAMPED TOGETHER AND A POWER COMBINER FORMED THEREFROM

(71) Applicant: THALES, Courbevoie (FR)

(72) Inventors: James Belluot, Versailles (FR);
Bertrand Gerfault, Jouy en Josas (FR)

(73) Assignee: THALES, Courbevoie (FR)

( * ) Notice: Subject to any disclaimer, the term of this patent is extended or adjusted under 35 U.S.C. 154(b) by 566 days.

(21) Appl. No.: 17/924,343

(22) PCT Filed: Jun. 9, 2021

(86) PCT No.: PCT/EP2021/065507
§ 371 (c)(1),
(2) Date: Nov. 9, 2022

(87) PCT Pub. No.: WO2021/250117
PCT Pub. Date: Dec. 16, 2021

(65) Prior Publication Data
US 2023/0188107 A1      Jun. 15, 2023

(30) Foreign Application Priority Data
Jun. 11, 2020      (FR) ..................................... 2006096

(51) Int. Cl.
*H01P 5/107* (2006.01)
*H01P 5/02* (2006.01)
*H01P 5/12* (2006.01)
*H03F 1/56* (2006.01)
*H03F 3/60* (2006.01)

(52) U.S. Cl.
CPC .............. *H01P 5/107* (2013.01); *H01P 5/028* (2013.01); *H01P 5/12* (2013.01); *H03F 1/56* (2013.01); *H03F 3/602* (2013.01)

(58) Field of Classification Search
CPC ................................... H01P 5/107; H01P 5/12
USPC ...................................................... 333/26, 125
See application file for complete search history.

(56) References Cited

U.S. PATENT DOCUMENTS 2,633,493 A * 3/1953 Cohn ........................ H01P 5/10
                                                        333/248
4,458,222 A    7/1984 Herstein et al.
10,340,574 B2  7/2019 Mohan et al.
2017/0104258 A1 4/2017 Orihashi

FOREIGN PATENT DOCUMENTS

EP        0 074 613 A1    3/1983
WO      2009/036134 A1    3/2009

* cited by examiner

*Primary Examiner* — Benny T Lee
(74) *Attorney, Agent, or Firm* — BakerHostetler

(57) ABSTRACT

A solidstate amplifier includes at least one interconnection, between a microstrip and a linearized impedance matching waveguide ridge, the interconnection being provided with a clamping device.

8 Claims, 5 Drawing Sheets

Section A-A

SOLID-STATE POWER AMPLIFIER COMPRISED OF A TWO-PART WAVEGUIDE HAVING AN IMPEDANCE RIDGE, WHERE THE TWO PARTS ARE CLAMPED TOGETHER AND A POWER COMBINER FORMED THEREFROM

CROSS-REFERENCE TO RELATED APPLICATIONS

This application is a National Stage of International patent application PCT/EP2021/065507, filed on Jun. 9, 2021, which claims priority to foreign French patent application No. FR 2006096, filed on Jun. 11, 2020, the disclosures of which are incorporated by reference in their entirety

FIELD OF THE INVENTION

The invention relates to a solid state power amplifier and to a power combiner comprising four such solid state amplifiers.

The invention lies in the field of solid state power amplifiers SSPA.

BACKGROUND

Amplification systems, such as SSPAs and traveling-wave tube amplifiers TWTA, with spatial or conventional combination that all exhibit major drawbacks are known.

Specifically, these amplification systems exhibit problems of compactness, of efficiency, of repair, of maintainability, of assembly, of assembly and development costs, of upgradability and of power limitation.

Tube amplifiers or traveling-wave tube amplifiers TWTA which use a heated filament, producing a liberation of electrons by thermionic emission, are known.

These electrons are then accelerated in a vacuum by way of a high-intensity electric field generated by a very high voltage VHV. Once accelerated, these electrons are focused in a beam which interacts with a microwave. Little by little, the continuous current, or direct current DC, contained in the electron beam is gradually converted into microwave energy as the electrons pass through the interaction line. This energy is then transmitted outside the tube, whereas the rest of the energy is transmitted to the collector and dissipated in the form of heat.

These amplifiers are very compact and operate with high efficiency, but on an all-or-nothing basis, and in the event of a fault, the products are out of service. These amplifiers require a very high voltage VHV, are highly technical, are very expensive to produce, and very difficult to maintain.

Monolithic solid state amplifiers SSPA that are spatially combined by way of Vivaldi-type antipodal lines which then radiate into cavities are also known.

These cavities form the input points of a conical-cavity combiner. This type of amplifier, for example described in document U.S. Pat. No. 10,340,574 B2, exhibits satisfactory compactness, quite low losses, and an absence of inter-stage interconnection problems. However, these amplifiers have a radial combination which renders the management of the heat dissipation very complex, optimal operation in pulsed mode virtually impossible since the energy reserve capacitors cannot be positioned as close to the monolithic microwave integrated circuits MMIC as possible.

Solid state amplifiers SSPA with hybrid combination or T configuration in which monolithic microwave integrated circuits MMIC are combined by way of hybrid, Wilkinson or T-junction couplers are also known.

Such amplifiers are relatively inexpensive, but exhibit relatively high losses, an absence of upgradability (power limitation), and are very difficult to repair due to the chip and wire assembly.

Therefore, none of the existing solutions mentioned above are satisfactory because these amplifiers all exhibit major defects.

Document EP0074613A1 which uses a ribbon link, as illustrated in FIG. 1 at reference 28, is also known. This embodiment uses the ridge power supply function, as illustrated in FIG. 1 corresponding to FIG. 3B of document EP0074613A1 with references 24, 25, 26 and 27. This ribbon link 28 has the advantage of being flexible, but does not permit easy repair because the implementation of such a ribbon requires a return to the factory and the use of specific machines.

SUMMARY OF THE INVENTION

An aim of the invention is to overcome the problems cited above, and notably to facilitate the repairability, the compactness and the upgradability.

Thus, according to a first aspect of the invention, there is proposed a solid state power amplifier comprising at least one interconnection, between a propagation line and a linearized impedance matching waveguide ridge, the interconnection being provided with a clamping device that guarantees direct contact between the ridge and the propagation line.

Such a system makes it possible to improve the repairability, the compactness and the upgradability.

According to one embodiment, the clamping device comprises at least one pressure screw.

Thus, the clamping of this screw makes it possible to constrain the ridge of the guide and to keep its end in contact with the propagation line on a printed circuit, thus offering a flexible and easily repairable link.

For example, the pressure screw comprises a spherical end (as in FIG. 6A) or a flat end (as in FIG. 6B).

In one embodiment, the clamping device comprises a pressure support stiffener.

Thus, the stiffener system will confer a degree of elasticity on the pressure device which will guarantee the absence of deformation, and the flat-end pressure screw will not perforate the material integral with the ridge.

According to another aspect of the invention, there is also proposed a power combiner comprising four solid state power amplifiers as claimed in one of the preceding claims, which are connected in an H configuration by a magic T device.

Thus, the arrangement in an H configuration allows a direct interconnection of the amplification modules to the combination system without the need to have to employ guided links, thus limiting the losses and improving the distribution of hot points.

In one embodiment, the elements of the combiner are mounted flat.

This makes it possible to easily manage the thermal environment and the maintenance, and also to stack several functions.

According to one embodiment, the magic T device is in one piece (in the sense that the line-to-guide transitions, the two-to-one basic magic Ts of the magic T device, the impedance matching sections and the bidirectional coupler are fused).

This makes it possible to assemble the various elements without losses by simple screw fastening, and to reduce the costs and the size.

For example, the one-piece magic T device comprises an S-flange, a bidirectional coupler, three two-to-one basic magic Ts, line-to-guide transitions and guide-to-coaxial links transitions.

BRIEF DESCRIPTION OF THE DRAWINGS

The invention will be better understood from studying a number of embodiments described by way of entirely non-limiting examples and illustrated by the attached drawing in which.

In all of the figures, elements having identical references are similar throughout the detailed description.

DETAILED DESCRIPTION OF THE INVENTION

Figure 2:
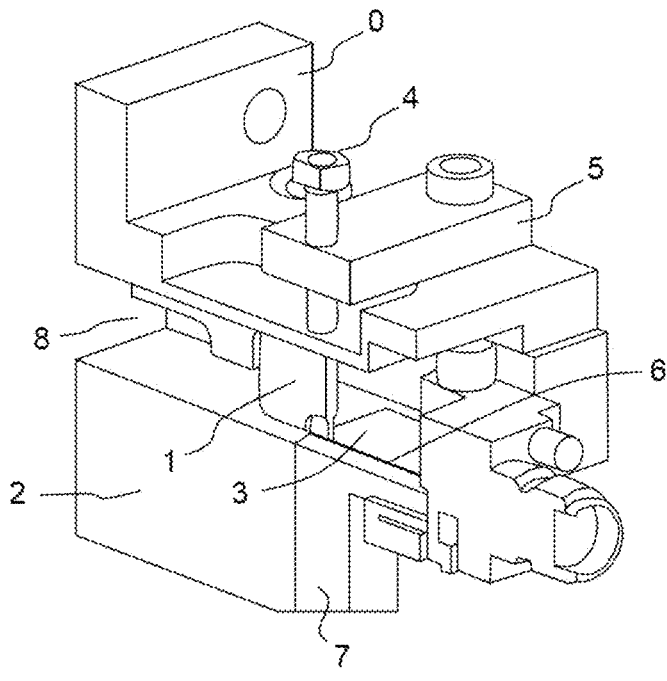
FIG. 2 schematically illustrates a solid state power amplifier according to one aspect of the invention.

A solid state power amplifier according to one aspect of the invention is illustrated in FIG. 2.

Figure 1:
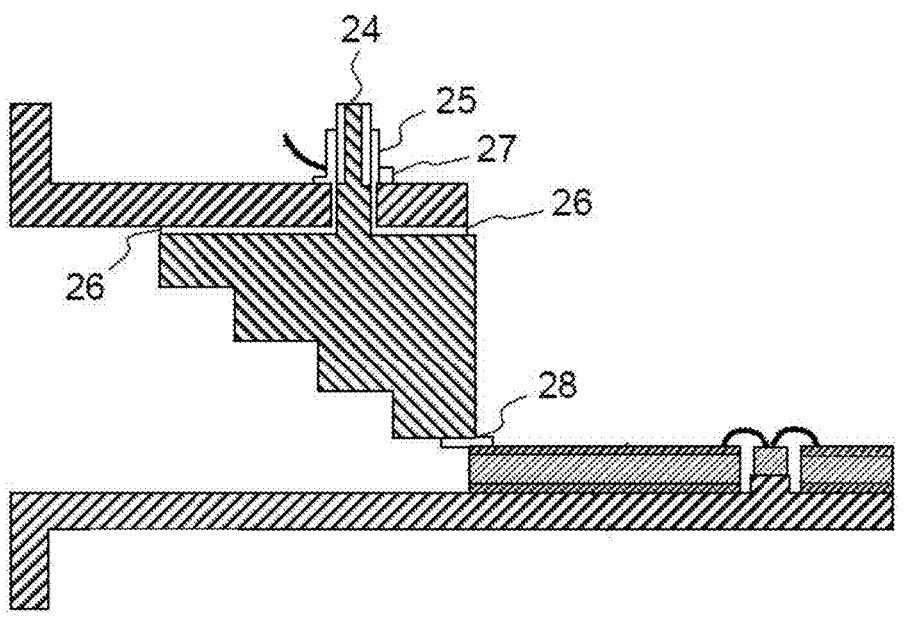
FIG. 1 schematically illustrates a solid state power amplifier according to the prior art.

By contrast to the principle of transition between a strip acting as propagation line and the waveguide ridge as described in the prior art of FIG. 1, the transition being implemented by a micro-ribbon link between the ridge of the guide and the microstrip, the present invention implements this transition by direct contact between the ridge and the propagation line, which is ensured by a clamping device comprising, for example, at least one pressure screw.

The solid state power amplifier comprises an upper part 0 of a waveguide, a linearized impedance matching ridge 1, and a lower part 2 of the waveguide, which lower part may, in certain cases, itself also have a linearized impedance matching ridge.

The solid state amplifier comprises a printed circuit 3 provided with a propagation line or microstrip 6, at least one pressure screw 4, and a pressure support stiffener 5. The amplifier also comprises a support base 7 and a cavity 8 of the waveguide. In FIGS. 1-4, and 6, only a device with a pressure screw 4 is shown, but in a non-limiting manner.

The solid state amplifiers of the prior art all use wired (ribbon link), connectorized (coaxial link) or radiated (antennae) interconnections.

Figure 3:
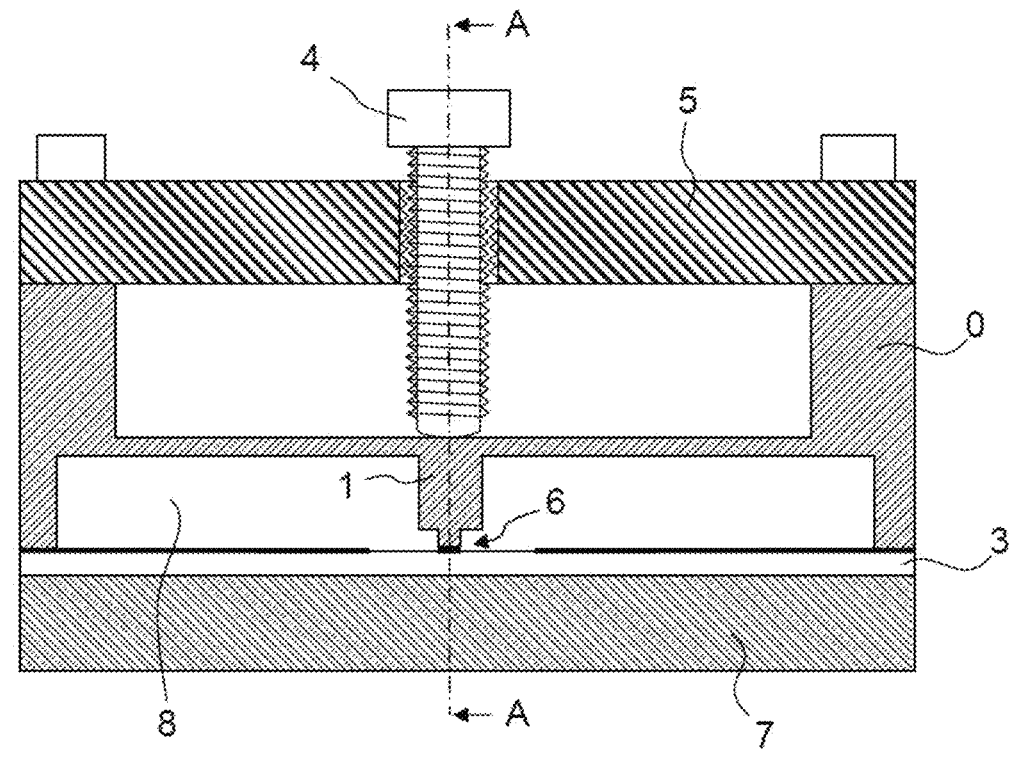
FIG. 3 schematically illustrates a solid state power amplifier according to one aspect of the invention.
Figure 4:
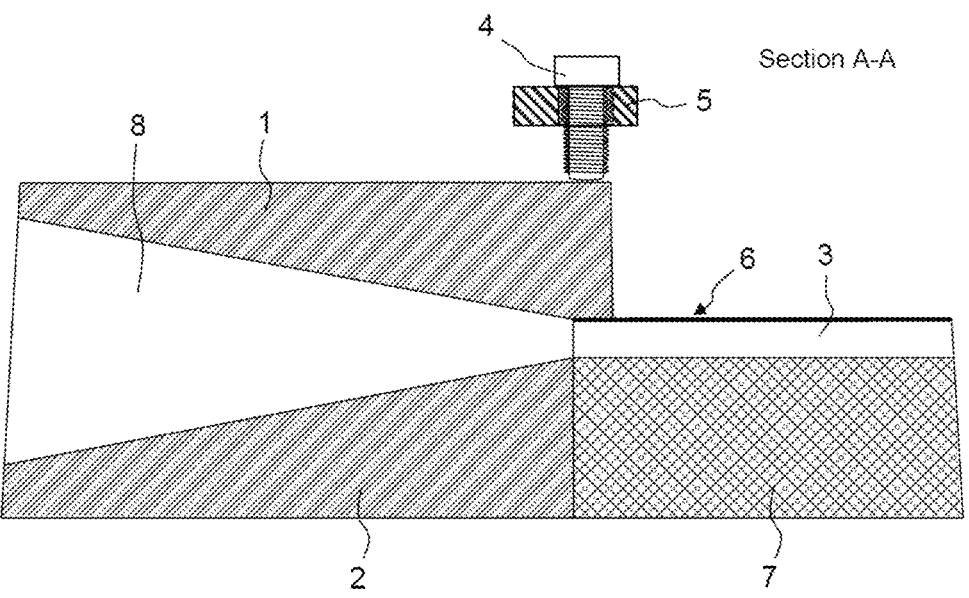
FIG. 4 schematically illustrates a solid state power amplifier according to another aspect of the invention.

FIGS. 3 and 4 show sectional views of a solid state amplifier according to one aspect of the invention, in a front view and side view, respectively.

The object of the solid state amplifier of the invention is to transmit an electromagnetic signal from a propagation line or microstrip 6 to a waveguide section or section of the cavity 8 of the waveguide.

This transmission may be implemented as a narrowband transmission by means of a single ridge 1. In order to widen the bandwidth to 6-18 GHz, it is necessary to utilize a double-ridge linearized impedance matching waveguide 3, 6 as illustrated in FIGS. 3 and 4. In order for this transmission to be effective, it is necessary to guarantee electrical contact between the ridge 1 and the microstrip 6.

However, due to production and assembly tolerances of the mechanical components and of the printed circuit 3 mounted on its printed circuit base 7 (there is therefore a printed circuit 3 mounted on a metallic base), a thin residual space separating the two transmission lines or ridges (ridge 1 and microstrip 6) remains which has to be bridged.

In order to ensure electrical contact over the entire temperature range (taking account of expansion effects) and during any intended use (requirements of resistance to vibrations and ability to withstand knocks), at least one pressure screw 4 is anchored in a pressure support stiffener 5 and deforms the cavity 8 by pressing on the ridge 1 while remaining in the elastic domain.

The pressing on the ridge 1 makes it possible to establish contact between its lower end and the propagation line or microstrip 6.

Proper operation of the amplifier is conditional on:

the pressing on the ridge 1, which has to be controlled, and the deformation, which has to be limited so as to not notably modify the dimensions of the cavity 8 (impact on the quality of the propagation);

the printed circuit with which the ridge 1 is in contact has to be tough and has to have a line or microstrip width that is compatible with the width of the ridge at its end;

the type of printed circuit has to be able to reach the expected power (50 W CW) over the entire range of temperatures, ranging from −40° to +85° C.;

the operating time of the solid state amplifier should not lead to degradation of the printed circuit, such that the printed circuit remains in the elastic domain;

the link has to be able to be mounted and removed by simple screwing and unscrewing without altering the performance.

Preferably, the substrate is resistant to deformations below a minimum pressure of 500 MPa, and is made of $Al_2O_3$ or woven glass reinforced hydrocarbon/ceramics such as DUROID (registered trademark) of the RO4350 or RO4003 type, and the tightening torque of the screw should not lead to irreversible deformation by remaining within the limits of the elastic domain.

Figure 5:
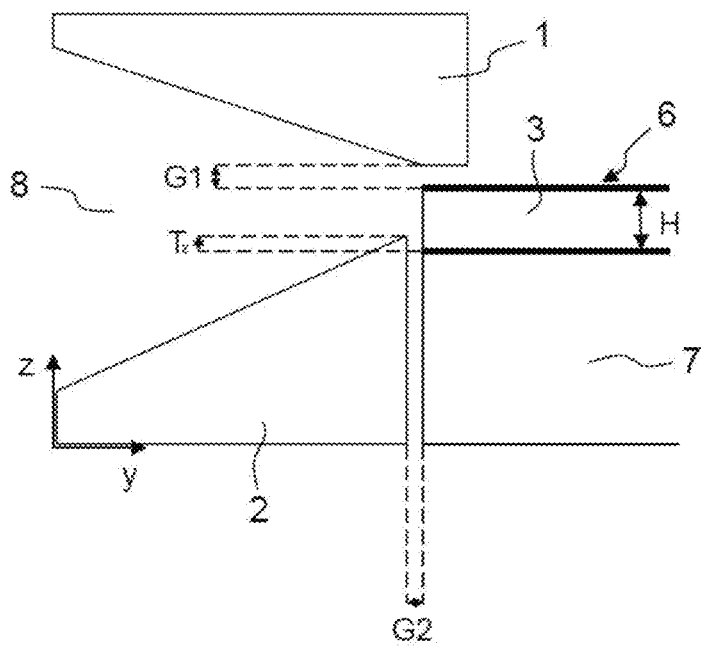
FIG. 5 schematically illustrates a solid state power amplifier according to another aspect of the invention.
Figure 6A:
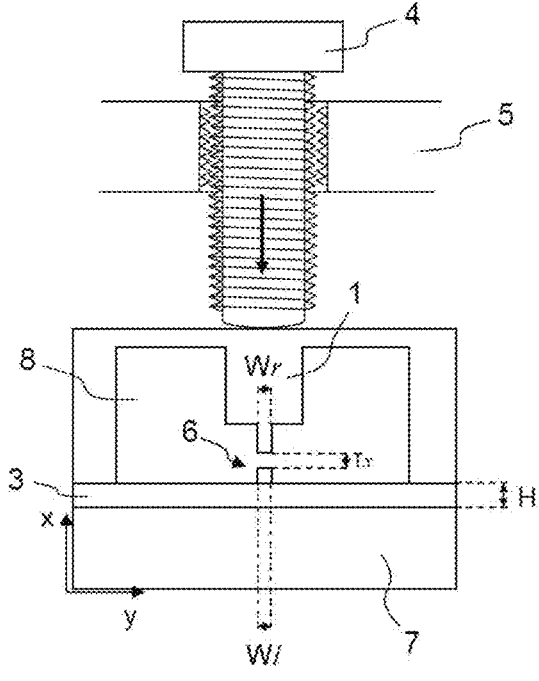
FIG. 6A schematically illustrates a solid state power amplifier according to another aspect of the invention.
Figure 6B:
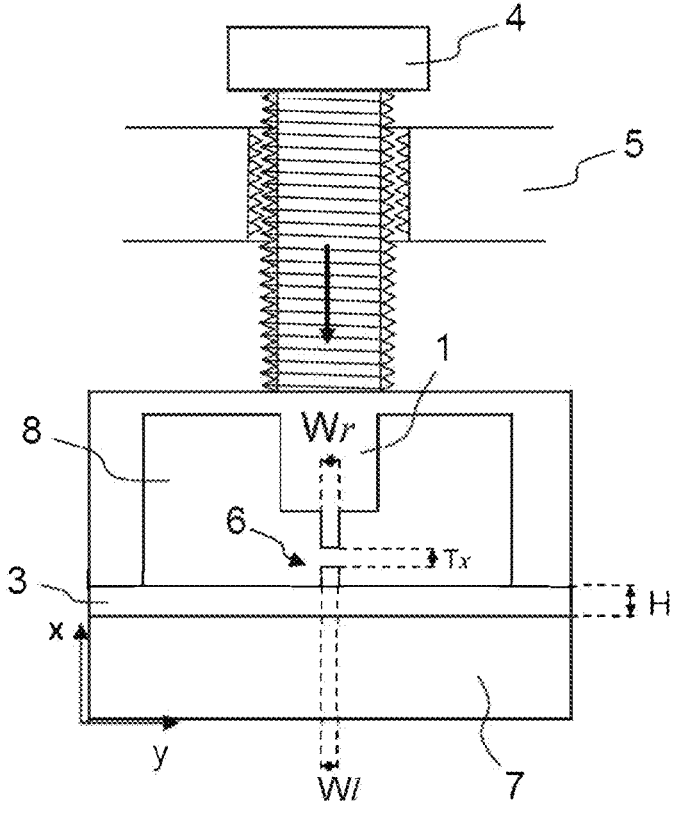
FIG. 6B schematically illustrates a solid state power amplifier according to another aspect of the invention.

In a preferred embodiment, the mechanical tolerances and assembly tolerances are compatible with the type of substrate used and therefore with its dielectric permittivity sr. Consequently, the maximum permissible dimension of the gap G1, as illustrated in FIGS. 5 and 6, is 0.1 mm in order to make sure to remain within the elastic domain of the clamping device or clamp. The tolerances are then smaller than 0.1 mm. The architecture illustrated in FIG. 7 allows the printed circuit to be brought into abutment against the lower part 2 of the waveguide, thus resulting in G2=0, a crucial element for proper microwave operation. Thus: G1 and the tolerances are <0.1 mm and G2=0.

As shown in FIG. 5, the tolerance Tz of the Z alignment between the lower waveguide 2 and the support base 7 remains much smaller than the thickness H of the substrate, with H/Tz>5.

Equally, it is important that the bearing zone of the ridge 1 is aligned with the microstrip, as shown in FIG. 6. Also, preferably, the tolerance Tx of the x alignment between the ridge 1 and the microstrip 6 remains much smaller than the width Wr of the ridge 1 at the contact zone with the printed circuit, or the width Wl of the microstrip 6 is larger than Wr to which the assembly tolerance of 0.1 mm is added. Simulations therefore imply that is necessary to have:

$$\frac{Wr}{Tx} < 4 \text{ or } Wl > Wr + 0.1 \text{ mm}$$

Thus, the target value εr of the substrate of the printed circuit is given by the following relationship:

$$\text{for } \frac{W}{h} < 1 \quad Z_0 = \frac{60}{\sqrt{\varepsilon_{eff}}} \ln\left(\frac{8h}{W} + \frac{W}{4h}\right)$$

$$\text{with } \varepsilon_{eff} = \frac{\varepsilon_r + 1}{2} + \frac{\varepsilon_r + 1}{2}\left[\left(1 + 12\frac{h}{W}\right)^{-\frac{1}{2}} + 0.04\left(1 - \frac{W}{h}\right)^2\right]$$

The substrate is preferably also a low-loss substrate, that is to say it has to offer the lowest possible tan delta (tan δ) (conventionally <0.001) in order to limit heating by linear losses and to offer excellent thermal conductivity.

Figure 7:
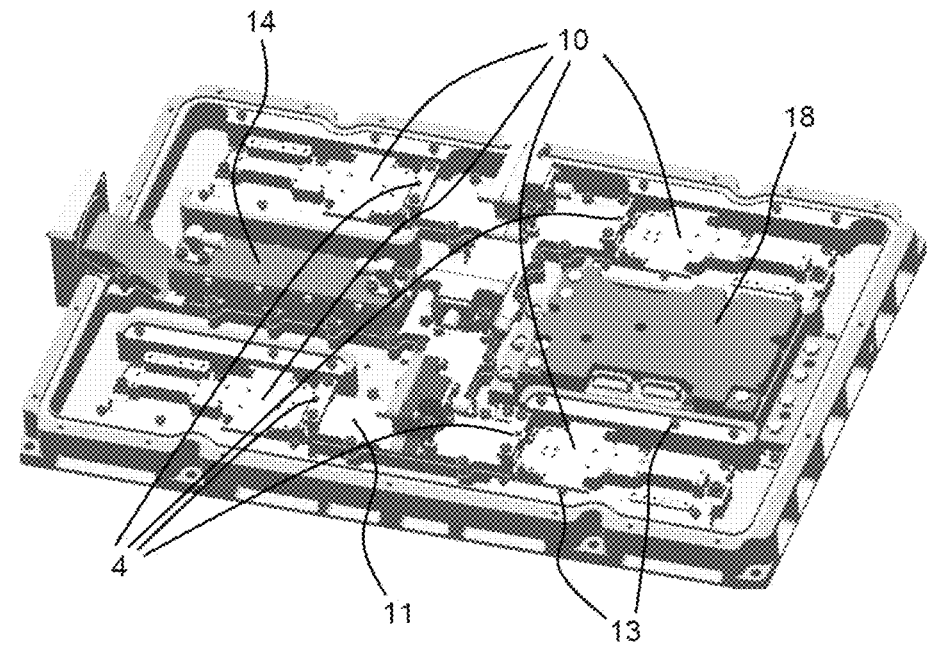
FIG. 7 schematically illustrates a power combiner according to another aspect of the invention.

As illustrated in FIG. 7, there is also proposed a power combiner comprising four solid state power amplifiers 10 as described above, which are connected in an H configuration by a magic T 11, referred to as four-to-one with H topology which has the particular feature that one half is fused with a frame 12 and the other half is assembled by screw fastening 13. The combiner comprises a bidirectional coupler 14. Furthermore, the upper part of the combiner device covers both the lower part of the combiner that is fused with the frame and the four solid state amplifier modules.

The pressure screws 4 make it possible to guarantee contact between the amplifiers 10 and the entries of the magic T 11.

The H configuration of the combiner makes it possible to optimize the footprint and the distribution of hot points. The four-to-one magic T is in one piece (S-flange and bidirectional coupler 14 are machined integrally) and incorporates microstrip-to-double-ridge waveguide transitions with non-standard impedance matching which allow optimal compactness without transition. The losses are therefore minimal and the efficiency is maximized.

The power amplifiers 10, the magic T device 11 and the bidirectional coupler 14 are assembled and removed very easily by simple screw fastening. Maintenance and repairability are thus greatly facilitated.

The interconnections of the combiner device are not hyperstatic.

The combiner device also comprises a conductor module or "driver" 18 to pre-amplify the signal.

The "flat" mounting configuration of the elements of the combiner device allows thermal factors to be managed easily. The modular design permits low-cost upgradability in addition to easy maintenance.

The combiner device offers isolation between channels which makes it possible to implement graceful degradation.

In this example, the substrate used is an alumina of thickness H=0.6 mm and the line thickness of which is Wl=0.6 mm for a characteristic impedance of 50 ohms. On the side of the abutting ridge, the width is Wr=0.4 mm and the length of overlap is 0.8 mm.

The invention claimed is:

1. A solid state power amplifier comprising, an upper part of a waveguide, a linearized impedance matching ridge, a lower part of the waveguide, and at least one interconnection between a propagation line and the linearized impedance matching waveguide ridge, said at least one interconnection being provided with a clamping device that guarantees direct contact between the ridge and the propagation line.

2. The solid state power amplifier as claimed in claim 1, wherein the clamping device comprises at least one pressure screw.

3. The solid state power amplifier as claimed in claim 2, wherein the pressure screw comprises a spherical end or a flat end.

4. The solid state power amplifier as claimed in claim 1, wherein the clamping device comprises a pressure support stiffener.

5. A power combiner device comprising four solid state power amplifiers as claimed in claim 1, which are connected in an H configuration by a magic T device.

6. The power combiner device as claimed in claim 5, wherein the four solid state power amplifiers connected in the H configuration by the magic T device are mounted flat.

7. The power combiner device as claimed in claim 5, wherein the magic T device is in one piece.

8. The power combiner device as claimed in claim 7, wherein the one-piece magic T device comprises an S-shaped flange, a bidirectional coupler, three two-to-one basic magic Ts, line-to-guide transitions, and guide-to-coaxial links transitions being fused with a frame.

* * * * *